(12) United States Patent
Zhang et al.

(10) Patent No.: US 6,509,212 B1
(45) Date of Patent: Jan. 21, 2003

(54) METHOD FOR LASER-PROCESSING SEMICONDUCTOR DEVICE

(75) Inventors: Hongyong Zhang, Kanagawa (JP); Naoaki Yamaguchi, Kanagawa (JP); Yasuhiko Takemura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/236,620

(22) Filed: Jan. 26, 1999

Related U.S. Application Data

(62) Division of application No. 08/641,695, filed on May 2, 1996, now Pat. No. 6,096,581, which is a continuation of application No. 08/400,867, filed on Mar. 8, 1995, now abandoned.

(30) Foreign Application Priority Data

Mar. 9, 1994 (JP) ............................................... 6-66592
May 13, 1994 (JP) ............................................. 6-124172

(51) Int. Cl.⁷ ...................... H01L 21/00; H01L 21/8238

(52) U.S. Cl. ........................ 438/149; 438/154; 438/199; 438/163; 438/164; 438/231; 438/232

(58) Field of Search ........................ 438/621, 655–657, 438/586, 592, 664, 659, 227, 231, 232, 233, 275, 149, 154, 199, 163, 164

(56) References Cited

U.S. PATENT DOCUMENTS

| | | | |
|---|---|---|---|
| 4,330,363 A | 5/1982 | Biegesen et al. | 117/54 |
| 4,466,179 A | 8/1984 | Kasten | 438/488 |
| 4,915,772 A | 4/1990 | Fehlner et al. | 156/620 |
| 5,145,808 A | 9/1992 | Sameshima et al. | 117/4 |

(List continued on next page.)

FOREIGN PATENT DOCUMENTS

| | | |
|---|---|---|
| EP | 0 091 806 | 10/1983 |
| JP | 58-127318 | 7/1983 |
| JP | 59-161014 | 9/1984 |
| JP | 2-42717 | 2/1990 |
| JP | 3-280531 | 12/1991 |
| JP | 4-242724 | 8/1992 |
| JP | 04-282869 | 10/1992 |
| JP | 5-40278 | 2/1993 |
| JP | 5-175235 | 7/1993 |
| JP | 5-203977 | 8/1993 |
| JP | 5-211167 | 8/1993 |
| JP | 05-251342 | 9/1993 |
| JP | 6-45272 | 2/1994 |
| JP | 6-59278 | 3/1994 |
| JP | 6-260502 | 9/1994 |

OTHER PUBLICATIONS

*Performance of Poly–si Thin Film Transistors. . .* , Fuse et al., Solid State Phenomena, vols. 37–38, 1994, pp. 565–570.
*Polycrystalline Silicon Thin–Film Transistors. . .* , Bonnel et al., IEEE Electron DEvice Letters, vol. 14, No. 12, Dec. 1993 pp. 551–553.

(List continued on next page.)

*Primary Examiner*—Ha Tran Nguyen
(74) *Attorney, Agent, or Firm*—Nixon Peabody LLP; Jeffrey L. Costellia

(57) ABSTRACT

A linear laser light which has an energy and is to be scanned is irradiated to a semiconductor device formed on a substrate, and then the substrate is rotated to irradiate to the semiconductor device a linear laser light which has a higher energy than that of the irradiated linear laser light and is to be scanned. Also, in a semiconductor device having an analog circuit region and a remaining circuit region wherein the analog circuit region is smaller than the remaining circuit region, a linear laser light having an irradiation area is irradiated to the analog circuit region without moving the irradiation area so as not to overlap the laser lights by scanning. On the other hand, the linear laser light to be scanned is irradiated to the remaining circuit region.

44 Claims, 9 Drawing Sheets

U.S. PATENT DOCUMENTS

| | | | |
|---|---|---|---|
| 5,194,853 A | | 3/1993 | Asada ........................ 345/100 |
| 5,247,375 A | | 9/1993 | Mochizuki et al. ............ 349/84 |
| 5,264,383 A | | 11/1993 | Young ......................... 438/151 |
| 5,365,875 A | | 11/1994 | Asai et al. ................... 438/487 |
| 5,372,836 A | | 12/1994 | Imahashi et al. .............. 438/5 |
| 5,403,762 A | | 4/1995 | Takemura .................... 438/164 |
| 5,403,772 A | | 4/1995 | Zhang et al. ................. 438/166 |
| 5,413,958 A | | 5/1995 | Imahashia et al. .......... 438/487 |
| 5,414,442 A | | 5/1995 | Yamazaki et al. ............. 345/89 |
| 5,432,122 A | | 7/1995 | Chae ........................... 438/157 |
| 5,449,637 A | * | 9/1995 | Saito et al. .................... 437/57 |
| 5,453,858 A | | 9/1995 | Yamazaki ...................... 349/43 |
| 5,477,073 A | | 12/1995 | Wakai et al. ................ 257/347 |
| 5,514,879 A | | 5/1996 | Yamazaki ...................... 257/65 |
| 5,529,630 A | | 6/1996 | Imahashi et al. ............ 118/665 |
| 5,529,937 A | | 6/1996 | Zhang et al. |
| 5,561,081 A | | 10/1996 | Takenouchi et al. ........ 438/166 |
| 5,563,426 A | * | 10/1996 | Zhang et al. .................. 257/66 |
| 5,565,377 A | | 10/1996 | Weiner et al. |
| 5,570,105 A | | 10/1996 | Koyama ....................... 345/98 |
| 5,589,406 A | | 12/1996 | Kato et al. ................... 438/164 |
| 5,614,732 A | | 3/1997 | Yamazaki ...................... 257/66 |
| 5,627,084 A | | 5/1997 | Yamazaki et al. |
| 5,680,147 A | | 10/1997 | Yamazaki et al. ............. 345/94 |
| 5,701,167 A | | 12/1997 | Yamazaki ...................... 349/42 |
| 5,708,252 A | | 1/1998 | Shinohara et al. ..... 219/121.73 |
| 5,767,930 A | * | 6/1998 | Kobayashi et al. ............ 349/42 |
| 5,849,601 A | | 12/1998 | Yamazaki ...................... 257/66 |
| 5,858,473 A | | 1/1999 | Yamazaki et al. ........... 427/554 |
| 5,859,445 A | | 1/1999 | Yamazaki ...................... 257/66 |
| 5,897,799 A | | 4/1999 | Yamazaki .............. 219/121.75 |
| 5,939,731 A | | 8/1999 | Yamazaki et al. ..... 219/121.73 |
| 5,943,593 A | | 8/1999 | Noguchi et al. ............ 438/487 |
| 5,968,383 A | | 10/1999 | Yamazaki et al. ..... 219/121.75 |
| 6,002,101 A | | 12/1999 | Yamazaki et al. ..... 219/121.75 |
| 6,011,277 A | | 1/2000 | Yamazaki ...................... 257/66 |
| 6,023,075 A | | 2/2000 | Yamazaki ...................... 257/72 |
| 6,159,777 A | | 12/2000 | Takenouchi et al. ........ 438/149 |
| 6,261,856 B1 | | 7/2001 | Shinohara et al. ............ 438/30 |

OTHER PUBLICATIONS

*Self–Referenced Poly Si TFT Applifier Readout. . .*, Fujieda et al., IEDM 1993, Proc., pp. 587–590.

Webster's II New Riverside University Dictionary, Houghton–Miffin Company, 1994.

U.S. Application Ser, No. 08/855,143, (Pending).

U.S. Application Ser. No. 08/999,703 (Pending).

U.S. Application Ser. No. 09/484,181 (Pending).

U.S. Application Ser. No. 09/165,150 (Pending).

U.S. Application Ser. No. 09/532,096 (Pending).

U.S. Application Ser. No. 09/166,157 (Now U.S. Patent No. 5,998,841).

U.S. Application Ser. No. 09/249,845 (Now U.S. Patent No.6,121,652).

U.S. Application Ser. No. 90/005,692 (Pending; Reexamination).

U.S. Application Ser. No. 90/005,686 (Pending; Reexamination).

Specifications and Drawings for Application Ser. No. 09/615,842, "Method for Laser–Processing Semiconductor Device", Filing Date: Jul. 13, 2000, Inventors: Hongyong Zhang et al.

Specifications and Drawings for Application Ser. No. 09/633,869, "Method for Laser PRocessing Semiconductor Device" Filing Date: Aug. 7, 2000, Inventors: Hongyong Zhang et al.

"Performance of Poly–Si Thin Film Tranasistors. . .", Solid State Phenomena, Vol. 37–38, 1994, pp. 565–570. (correction)

"Polycystalline Silicon Thin–Film Transistors. . . ", Bonnel et al., IEEE Electron Device Letters, vol. 14, No. 12, pp. 551–553, Dec. 1993. (correction)

*Self–Referenced Poly Si TFT Applifier Readout. . .*, Fujieda et al., IEDM 1993, Proc., pp. 587–590. (correction)

\* cited by examiner

FIG. 1A  FIG. 1B  FIG. 1C
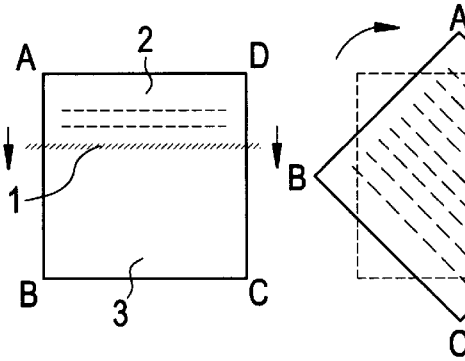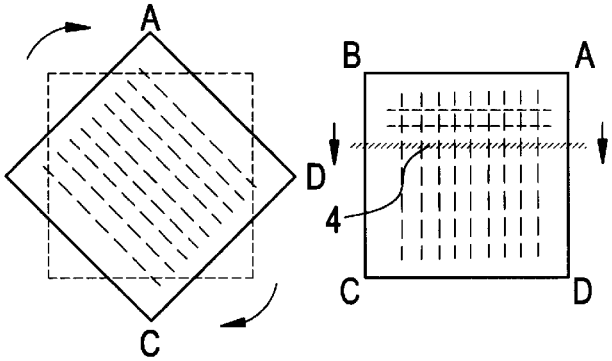
FIG. 2A  FIG. 2B
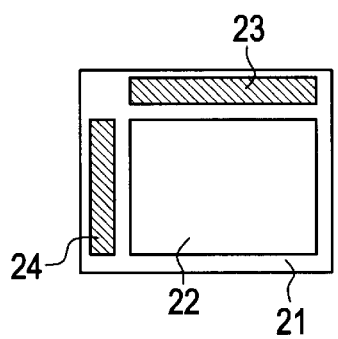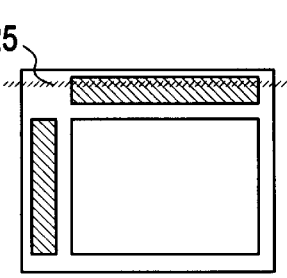
FIG. 2C  FIG. 2D
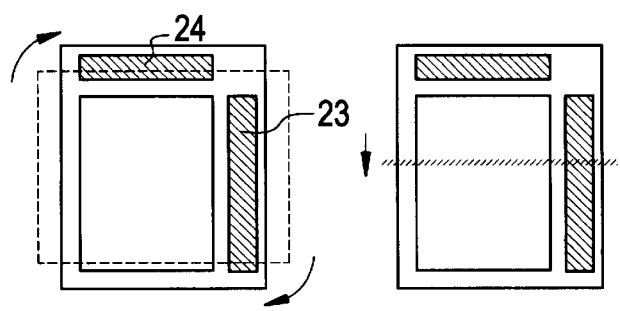
FIG. 3
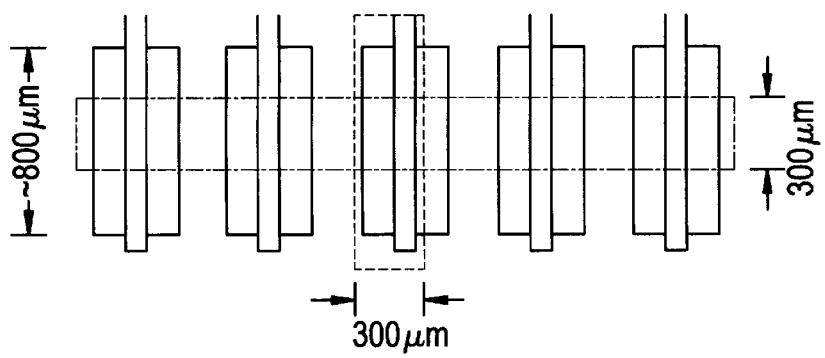

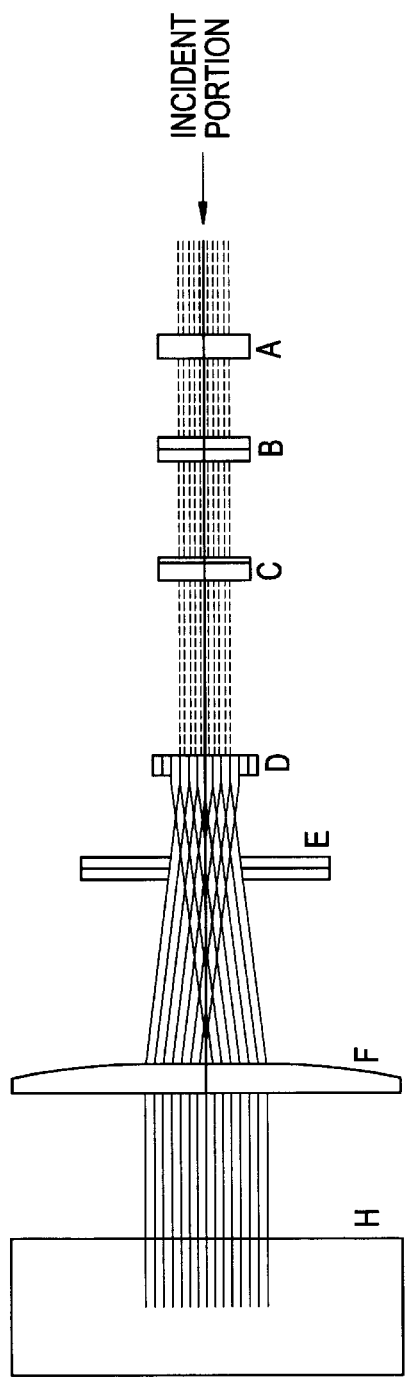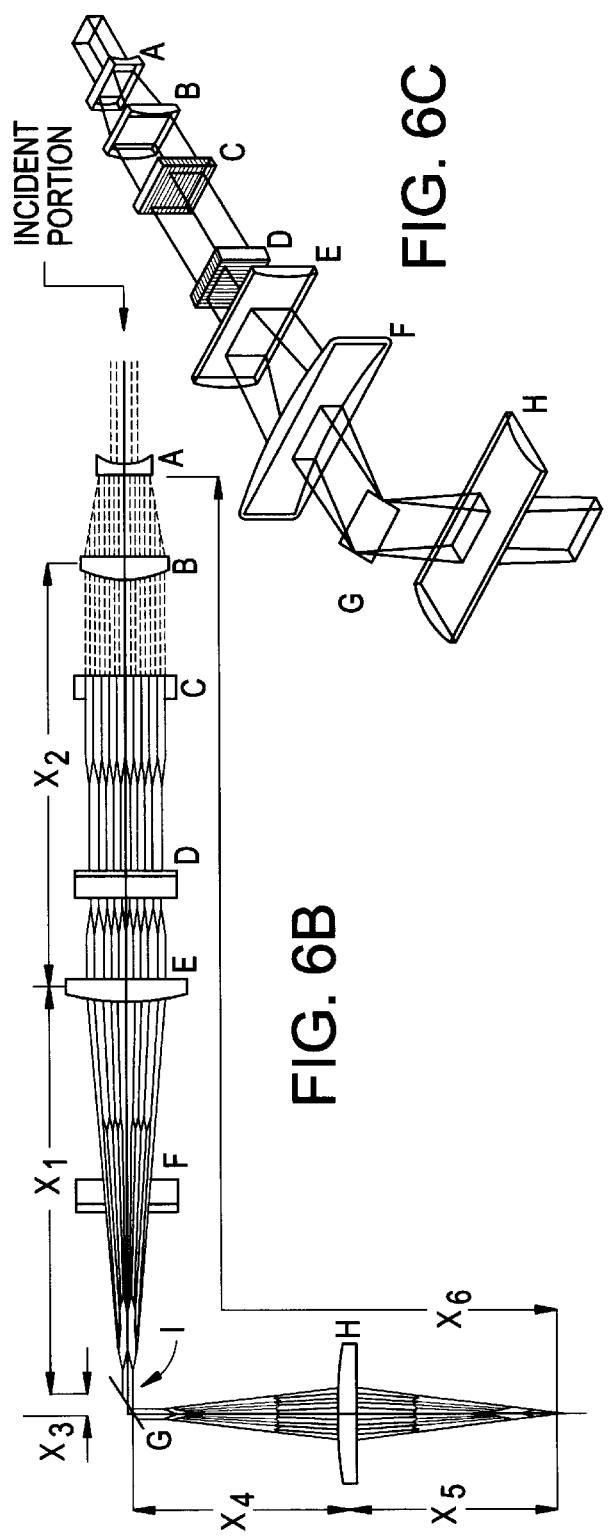

METHOD FOR LASER-PROCESSING SEMICONDUCTOR DEVICE

This application is a Divisional application of Ser. No. 08/641,695, filed May 2, 1996, now U.S. Pat. No. 6,096,581, which is a continuation of application of Ser. No. 08/400,867, filed Mar. 8, 1995, now abandoned.

BACKGROUND OF THE INVENTION

The present invention relates to a method for laser light irradiation (so called laser annealing) in fabrication of a semiconductor device, and to a method for fabricating a semiconductor device by laser light irradiation, wherein mass production is high, characteristics are little different among the devices, and a production yield is high. More particularly, the invention relates to a method for improving or recovering (repairing) crystallinity of a semiconductor material by irradiating the material with laser light. The semiconductor material includes a semiconductor material having wholly or partially amorphous components, a substantially intrinsic polycrystalline semiconductor material, and a semiconductor material whose crystallinity has been severely deteriorated by damage due to ion irradiation, ion implantation, or ion doping.

Recently, researches have been conducted concerning low temperature semiconductor device fabrication processes mainly because it has become necessary to form semiconductor devices on an insulating substrate made of glass or the like. Also, miniaturization of devices and making of a multilayer structure have required.

In semiconductor fabrication processes, it may be necessary to crystallize an amorphous component contained in a semiconductor material or an amorphous semiconductor material. Also, it may be necessary to recover (repair) the crystallinity of a semiconductor material deteriorated by ion irradiation. Furthermore, when there exists crystallinity, it may be required to be enhanced. In general, thermal annealing is used for these purposes. When silicon is used as a semiconductor material, it is annealed at 600 to 1100° C. for 0.1 to 48 hours or longer. As a result, the amorphous component is crystallized, the crystallinity recovered, or the crystallinity is improved.

In thermal annealing, as higher temperature is used, the processing time can be shortened. However, at 500° C. or lower, almost no effect produces. At about 600° C., a long processing time is needed. Accordingly, it has been required that the thermal annealing be replaced by other means in order to lower the process temperature. Hence, a laser irradiation technique has attracted attention as an ultimate low temperature process. Since laser light can be irradiated only onto a region that needs high energy corresponding to the energy of thermal annealing, it is not necessary that the whole substrate be processed to a high temperature.

Generally, two methods have been proposed to irradiate laser light. First method uses a continuous oscillating laser such as an argon ion laser. The laser beam having a spot shape is irradiated to a semiconductor material. In this method, the semiconductor material is melted by variations in the energy distribution inside the beam and by movement of the beam, and then the material is solidified mildly. As a result, the semiconductor material is crystallized. Second method employs a pulse oscillating laser such as an excimer laser. The pulse laser having high energy is irradiated to a semiconductor material. In this method, the material is momentarily melted and solidified, whereby the material is crystallized.

The first method has the problem that it takes a long time to perform the processing, for the following reason. Since the maximum energy of a continuous oscillating laser is limited, the maximum beam spot size is several millimeters. On the other hand, in the second method, a large spot of several $cm^2$ or more can be used because the maximum energy is very large. Hence, the productivity can be improved.

However, in order to process one large area substrate with a normally used beam having a square or rectangle form, it is necessary to scan (move) the beam vertically and horizontally. This produces limitations on the productivity. This problem can be solved by modifying the cross section of the beam into a linear form, making the width of the beam larger than the size of the substrate to be processed, and scanning this beam.

The remaining problem for improvement is uniformity of the effect of laser irradiation. A pulse laser somewhat varies in energy from pulse to pulse and so it is difficult to uniformly process the whole substrate. Especially, it is important to obtain uniform the characteristics of regions where adjacent laser spots overlap each other.

Also, when a pulse laser is irradiated, even if the uniformity of the energy inside the beam of one shot pulse can be accomplished by improvements in the optical system, it is difficult to reduce variations in the characteristics of devices due to overlap of pulse laser. Especially, where devices are located just at ends of the beam of laser light, the characteristics (especially the threshold voltages of MOS transistors) vary considerably from device to device.

In semiconductor devices, considerable variations in the threshold voltages of digital circuits are admitted. In analog circuits, the difference between the threshold voltages of adjacent transistors is required to be 0.02 V or less.

It has been reported that if weak pulse laser light is preliminarily irradiated before irradiation of strong pulse laser light, the nonuniformity is lowered and the uniformity is improved. However, overlap of laser spots has not been discussed sufficiently.

SUMMARY OF THE INVENTION

The object of the present invention is to solve the above problem by using a linear laser beam (linear laser light). That is, a relatively weak, first pulse linear laser light is irradiated to a substrate. Then, a second linear laser light having higher energy is irradiated at right angles to the first laser light to process the substrate. Absolute outputs of the first laser light and the second laser light may be determined by the required uniformity and characteristics.

In order that the first linear laser light make substantially right angles with respect to the second laser light, the direction of either laser light is varied, or the substrate is rotated at about a ¼ revolution (approximately 90°), generally n/2+¼ (n is 0, 1, 2, ...) revolution, i.e., (n/2+¼)×360°. A basic embodiment is shown in FIGS. 1A–1C. A substrate of a rectangle ABCD is disposed as shown in FIG. 1A. A linear laser light 1 is scanned in the direction indicated by the arrow, i.e., from top to bottom, to process the substrate. It is assumed that the laser light output has a relatively weak energy. In the region 2 (indicated by the broken lines) irradiated with the laser light, nonuniformity by variations in pulse intensity of the laser light and overlap of laser spots may be observed. A region 3 is not yet irradiated with the laser light.

Then, the substrate is rotated at a ¼ revolution, i.e., 90° (FIG. 1B). The laser light 4 is scanned again in the direction indicated by the arrow, or from top to bottom, to process the substrate. At this time, the laser light output is larger than the laser light output irradiated first (FIG. 1C).

From the above description, in the present invention, the direction of the nonuniformity due to second laser irradiation is perpendicular to that the nonuniformity due to the first laser irradiation. Therefore, since these two kinds of nonuniformities cancel out, semiconductor devices having high uniformity can be obtained.

The present invention can be applied to, as an object irradiated with a laser light, a film having no pattern, or substantially a completed device. Since the present invention is characterized in that two linear laser beams are used substantially in an orthogonal relation to each other and irradiated to the object at least twice, the laser light can be used less wastefully for square and rectangular substrates than for circular substrates. In the present invention, a circular substrate can be processed. In the invention, some patterns are available, depending on configurations of circuits formed on a substrate to be processed.

Also, it is desired to irradiate a laser light which is large enough to cover the Whole circuit simultaneously, to prevent variations by overlap of laser beams. In practice, however, this is impossible to achieve. In the present invention, a relatively narrow region in which the laser beams do not overlap each other and a relatively wide region in which the laser beams overlap each other are formed on a substrate, to obtain sufficient characteristics as a whole.

In the present invention, the circuits formed on the substrate are divided into a first circuit region having mainly an analog circuit and a second circuit region which is less closely associated with analog elements. The beam size of the laser light is larger than the first circuit region. In this way, the first circuit region can be totally irradiated with the laser light substantially without moving the laser light.

In the first circuit region, the laser light is irradiated without substantially moving the laser light. Therefore, in the first circuit region, overlap of the laser beam do not produce. On the other hand, in the second circuit region, the laser light is irradiated while scanning the laser light. As a result, the laser beams overlap with each other.

In a monolithic liquid crystal display device which both an active matrix circuit and a peripheral circuit (driver circuit) for driving the active matrix circuit are formed on the same substrate, the first circuit region including mainly analog circuits corresponds to the driver circuit for driving the active matrix circuit, especially a source driver (column driver) circuit for outputting an analog signal. The second circuit region less closely associated with analog elements corresponds to the active matrix circuit and to a gate driver (scan driver) circuit.

In the present invention, it is necessary to match the shape of the laser beam to such circuits or to match the shapes of the circuits to the laser beam. Generally, it is desired to use the laser beam having a linear or rectangular form. In the liquid crystal display device, since the column driver and the scan driver are formed substantially in a perpendicular relation to each other, the direction of the laser light is varied, or the substrate is rotated at about a ¼ revolution, approximately 90°, generally n/2+¼ (n is 0, 1, 2, . . . ) revolution, i.e., (n/2+¼)×360° as described above.

By the above processing, in the first analog circuit region, since overlap of the laser beam do not produce, the uniformity of the laser beam within its plane (in-plane uniformity) is important. Consequently, devices having uniform characteristics can be formed by sufficiently improving the in-plane uniformity of the laser beam. On the other hand, in the second circuit region, variations in characteristics are inevitably caused by overlap of the laser beams. However, slight variations are admitted essentially in such a circuit. Hence, no great problems produce.

In this manner, in the present invention, the whole circuit formed on the substrate is prevented from being affected by overlap of the laser beams. In consequence, the characteristics of the whole circuit are improved.

BRIEF DESCRIPTION OF THE DRAWINGS

FIGS. 1A–1C are views illustrating the concept of the present invention;

FIGS. 2A–2D are views illustrating a laser-processing method according to the invention;

FIG. 3 is a diagram illustrating TFTs forming analog switches of a column driver in an embodiment of the invention;

FIGS. 6A–6C are optical system diagrams in the laser annealing apparatus shown in FIG. 5;

DETAILED DESCRIPTION OF THE PREFERRED EMBODIMENTS

EMBODIMENT 1

Figure 5:
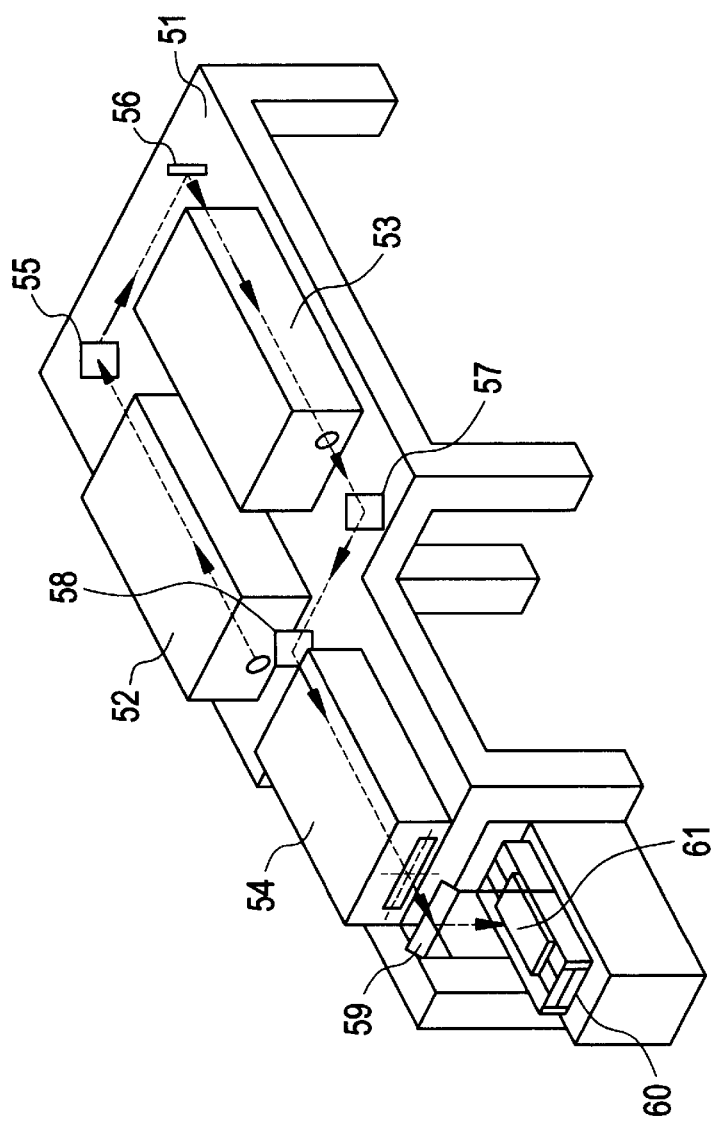
FIG. 5 is a perspective structure view of a laser annealing apparatus used in the invention.

FIG. 5 is a perspective view of a laser annealing apparatus used in the present invention. Laser light is generated by a resonator (oscillator) 52 and input to an amplifier 53 via total reflection mirrors 55 and 56, to amplify the laser light. The amplified laser light is introduced into an optical system 54 via total reflection mirrors 57 and 58. The laser light is a rectangle shape having approximately 3×2 $cm^2$ but the laser light is processed (focused) by the optical system 54 into a linear beam having a length of 10 to 30 cm and a width of 0.3 cm. The maximum energy of the laser light produced from the optical system 54 is 1000 mJ per shot.

The optical path inside the optical system 54 is shown in FIGS. 6A–6C. FIG. 6A is an upper view, FIG. 6B is a side view and FIG. 6C is a perspective view. The laser light incident on the optical system 54 passes through a cylindrical concave lens A, a cylindrical convex lens B, a lateral flyeye lens C, and a longitudinal flyeye lens D. Since the light passes through the flyeye lenses C and D, the energy distribution of the laser light changes from a gaussian distribution to a square distribution. The laser light also passes through cylindrical convex lenses E and F and is focused onto a cylindrical lens H via a mirror G (mirror 59 in FIG. 5). Then, the focused laser light is irradiated to a sample.

In the present embodiment, distances X1 and X2 are constant. The distance X3 between a virtual focus I (arising because the flyeye lenses differ in curvature) and the mirror G and distances X4 and X5 are adjusted by magnification M and focal distance F. That is, among these factors, there exist relations given by $$M=(X_3+X_4)/X_5$$

$$1/F=1/(X_3+X_1)+1/X_5$$

The total optical path length X6 is about 1.3 m.

The use of the linear laser light greatly improves the throughput. In particular, the linear laser beam output from the optical system 54 is irradiated to a sample 61 via the total reflection mirror 59. Since the width of the laser beam is equal to or greater than the width of the sample 61, the sample 61 may be moved only in one direction. A stage and a driver 60 for the sample 61 are simple in structure and can be easily maintained. Also, when the sample 61 is placed, it can be readily aligned. In the present invention, the sample 61 may be rotated in addition to moving it in one direction.

On the other hand, since it is impossible for the laser radiation by the laser light having approximately square shape to irradiate the whole substrate, it is necessary to move the sample 61 both vertically and horizontally, i.e., in two dimensions. However, this complicates the structure of the driver 60. Also, the alignment must be made in two dimensions and so this is difficult to accomplish. Especially, where the alignment is made manually, time is consumed wastefully during this process. Hence, the productivity deteriorates. It is necessary to hold these devices on a stable pedestal 51 such as a vibration-proof support.

The present embodiment relates to a monolithic active matrix liquid crystal display (AMLCD) device where an active matrix circuit and a peripheral circuit for driving the matrix circuit are formed on the same substrate. Thin film transistors (TFTs) are used in the AMLCD device. The process for fabricating these TFTs is roughly as follows.

(1) A silicon oxide film is formed as a base layer on a glass substrate. An amorphous silicon film is formed on the silicon oxide film. An agent for promoting crystallization such as nickel acetate is applied to the top surface of the amorphous silicon film.

(2) The amorphous silicon film is crystallized by solid phase growth, for example, at 550° C. for 8 hours in a nitrogen atmosphere.

(3) The crystallized silicon film is processed with laser radiation in order to improve the crystallinity.

(4) The silicon film is etched to form an island silicon region.

(5) A gate insulating film (silicon oxide) is formed.

(6) Gate electrodes are formed.

(7) An impurity such as phosphorus or boron is implanted to form source and drain.

(8) The implanted impurity is activated by laser irradiation.

(9) An interlayer insulator is formed.

(10) Electrodes are formed on the source and drain.

The present embodiment relates to the above-described laser irradiation process (3) performed to further improve the crystallinity of the polycrystalline silicon film. The present embodiment is illustrated in FIGS. 2A–2D. As shown in FIG. 2A, in the AMLCD device, an active matrix circuit 22, a column driver 23, and a scan driver 24 are formed on a substrate 21. The column driver 23 and the scan driver 24 are similar in circuit configuration. Generally, a large number of TFTs are formed in a longitudinal direction of the driver region, as shown in FIG. 3 representing analog switch TFTs for the column driver. Each TFT has a large channel width of about 800 μm.

As shown in FIG. 2B, a linear laser light 25 is scanned in the direction indicated by the arrow (i.e., from top to bottom as viewed in the figure) and irradiated at a substrate temperature of 200° C. in the atmosphere pressure. The laser light is a KrF excimer laser (having a wavelength of 248 nm, an oscillation frequency of 10 Hz and an energy density of 200 mJ/cm2) and scanned at a scanning speed of 3 mm/sec. Therefore, the laser light is moved in steps of 300 μm in the direction indicated by the arrow. Since the width of the laser beam is 0.3 mm, about 10 shots of the laser light are irradiated to each location.

Thereafter, the substrate is rotated through 90° in a clockwise direction (FIG. 2C). The laser light is again scanned in the direction indicated by the arrow to perform the laser irradiation process at a substrate temperature of 200° C. in the atmosphere pressure (FIG. 2D). This laser irradiation differs from the previous laser irradiation only in that the energy density is 300 mJ/cm$^2$.

Since the energy density of the second laser irradiation is greater than that of the first laser irradiation, the characteristics of the semiconductor device are affected materially. Although the present invention considerably reduces laser energy variations, complete suppression is not yet achieved. In FIG. 3, in a column driver, laser lights overlap each other on a region indicated by the dot-and-dash line as a result of the first laser irradiation. Then, the laser lights move longitudinally of the column driver and so the laser lights overlap each other in the region indicated by the dotted line.

The TFTs are especially affected greatly, because the energy density of the second laser irradiation is large. Therefore, the characteristics of adjacent TFTs may be affected greatly by variations in energy density among each shot in the laser radiation. In practice, the variations can be suppressed sufficiently by preliminary laser irradiation. In a circuit having analog switches such as the column driver, a difference of the threshold voltages between adjacent TFTs should not be 0.02 V or more.

For this reason, with the method of FIGS. 2A–2D, there is the possibility that the TFTs of the column driver differ greatly in threshold voltage. Accordingly, a method of FIGS. 4A–4E is used.

Figure 4A:
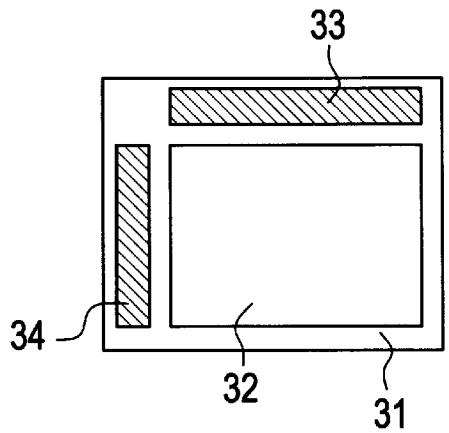
FIGS. 4A–4E are views illustrating another laser processing method according to the invention.
Figure 4B:
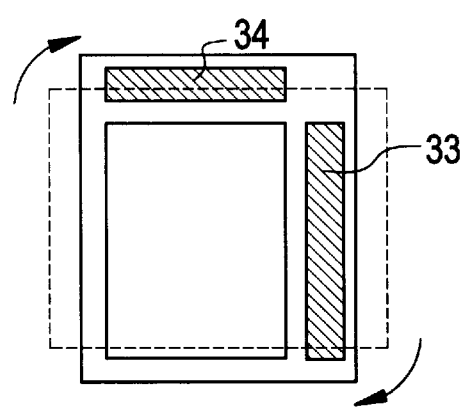

A substrate 31 on which an active matrix circuit 32, a column driver 33, and a scan driver 34 are formed is placed in the same arrangement as in FIG. 2A (FIG. 4A) and rotated at 90° in a clockwise direction (FIG. 4B).

Figure 4C:
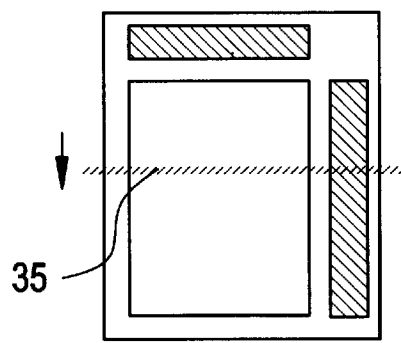
Figure 4D:
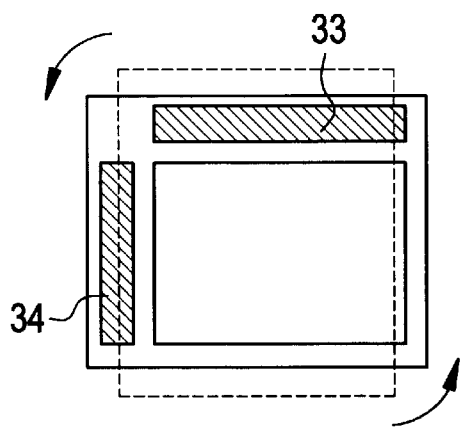

Then, laser light 35 is scanned in the direction indicated by the arrow (from top to bottom-as viewed in the figure) to perform laser processing at a substrate temperature of 200° C. in the atmosphere pressure (FIG. 4C). The laser light is irradiated under the same conditions as in the case already described in FIGS. 2A–2D. That is, the oscillation frequency is 10 Hz. The energy density is 200 mJ/cm2. The scanning speed is 3 mm/sec. Then, the substrate 31 is rotated in a counterclockwise direction (FIG. 4D).

Figure 4E:
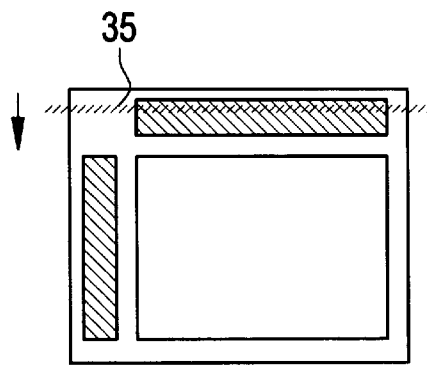

The laser light 35 is scanned in the direction indicated by the arrow to perform laser processing (FIG. 4E). The laser irradiation condition is the same condition as the previous laser irradiation condition except that the laser energy density is 300 mJ/cm$^2$.

In this method, the first laser irradiation produces an overlap on the region indicated by the dotted line in FIG. 3 on the column driver 33. When driver intenser laser light is irradiated, an overlap is produced in the region indicated by the dot-and-dash line in FIG. 3. In consequence, variations in the characteristics of the TFTs are suppressed greatly.

The scan driver 34 may suffer from the same problems as the problems with respect to the column driver 33 in the method of FIGS. 2A–2D. However, no analog switches are formed in the scan driver 34, unlike the column driver 33. It suffices to suppress the variations in the threshold voltages of the adjacent TFTs to about 0.1 V. This degree of variations can be accomplished, for example, by the method illustrated in FIGS. 1A–1C.

In this way, the present invention can be expanded further to improve the uniformity of semiconductor devices. Although the present embodiment relates to improvements in the crystallinity by laser irradiation, the process (8) for activating source and drain regions after introduction of a dopant can be carried out similarly.

EMBODIMENT 2

In the present embodiment, the laser annealing apparatus of FIG. 5 is used. The laser light incident on an optical system 54 is a rectangle shape having approximately 3×90 mm$^2$ but the laser light is processed (focused) by the optical system 54 into a linear laser beam having a length of 100 to 300 mm and a width of 10 to 30 mm. The maximum energy of the laser light passed through the optical system 54 is 30 J per shot.

The above laser annealing apparatus may be used alone or in combination with other apparatus such as a plasma CVD film deposition apparatus, an ion implantation apparatus (ion doping apparatus), a thermal annealing apparatus, or other semiconductor fabrication apparatus. This combination is known as a multi-chamber system.

The present embodiment relates to a monolithic AMLCD device. In this device, an active matrix circuit, a column driver, and a scan driver are formed on a substrate, as described above. In practice, when a laser irradiation is conducted, only a uniform film is formed on the substrate. The column driver and the scan driver have shift registers. Since the column driver outputs an anal)g signal, the column driver further includes an amplifier (buffer circuit).

The TFTs used in the AMLCD device are manufactured as summarily described above. The present and subsequent embodiments relate to laser irradiation process (3) for further improving the crystallinity of polycrystalline silicon film.

Figure 7A:
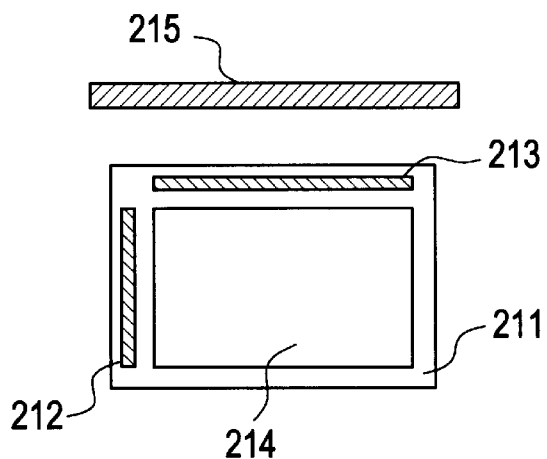
FIGS. 7A–7E are views illustrating another laser processing method according to the invention.
Figure 7B:
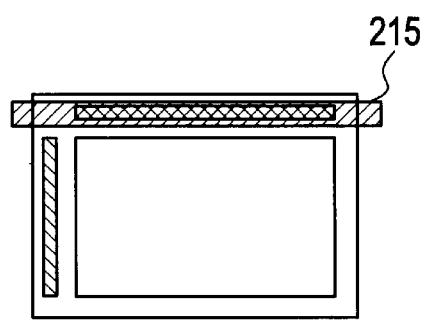

FIGS. 7A–7E show laser processes in the present embodiment. As shown in FIG. 7A, a laser beam irradiation region 215 is a rectangular shape having a width of 10 mm and a length of 300 mm and is large enough to irradiate a whole column driver 213. A substrate 211 is moved to irradiate the laser light to the column driver 213. At this stage, the laser light is not irradiated to the substrate 211. Subsequently, the substrate 211 is irradiated with the laser light at a substrate temperature of 200° C. in the atmosphere pressure in such a way that the laser beam and the substrate 211 are hardly moved. The laser light is a KrF excimer laser having a wavelength of 248 nm, an oscillation frequency of 10 Hz, and an energy density of 300 mJ/cm$^2$. The number of the laser pulses is 10 shots. After the required number of shots in the laser light is irradiated, the laser irradiation is stopped (FIG. 7B).

Figure 7C:
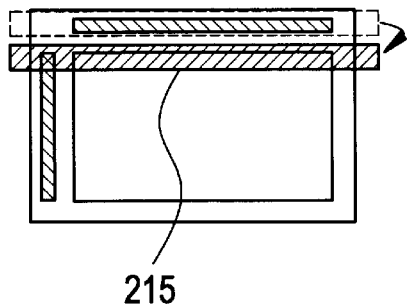
Figure 7D:
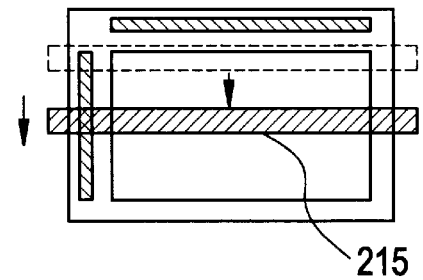

Then, the substrate 211 is moved from top to bottom as viewed in FIG. 7C up to the position where the irradiation region 215 overlaps the upper portions of an active matrix region 214 and a scan driver 212 (FIG. 7C). Thereafter, the substrate 211 is moved while irradiating the laser light (FIG. 7D). The oscillation frequency is 10 Hz. The energy density is 300 mJ/cm2. The scanning speed is 10 mm/sec. Therefore, the irradiation region 215 moves in steps of 1 mm. Since the width of the laser light is 10 mm, about 10 shots in the laser radiation are irradiated to each location.

Figure 7E:
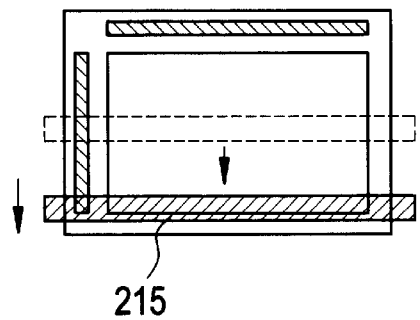

The laser light is scanned to the lower end of the substrate 211, so that the scan driver 212 and the active matrix region 214 are irradiated with the laser light (FIG. 7E).

In the present embodiment, overlap of the laser beam do not produce on the column driver 213. As a result, the TFTs in the column driver 213 little differ from each other in threshold voltage. Typically, the difference between the threshold voltages of adjacent TFTs is 0.01 V or less. Variation in threshold voltage within the column driver 213 is 0.05 V or less. Similarly, other characteristics differ only a little among the TFTs. On the other hand, adjacent laser beams overlap each other on the scan driver 212 and the active matrix region 214. Consequently, the difference between the threshold voltages of the adjacent TFTs in the scan driver 212 is about 0.1 V. Variation in threshold voltage within the scan driver 212 is similar value. In the active matrix region 214, a similar value is obtained. Such variations do not hinder the operation of these circuits.

The column driver may be irradiated with the laser light after the scan driver 212 and the active matrix region 214.

EMBODIMENT 3

Figure 8A:
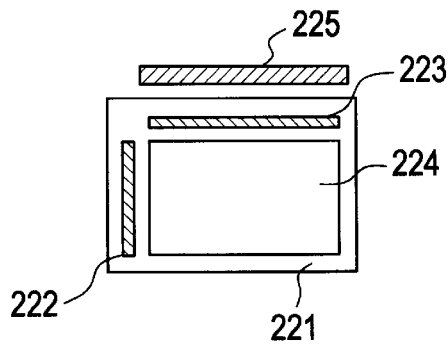
FIGS. 8A–8G are views illustrating another laser processing method according to the invention.
Figure 8B:
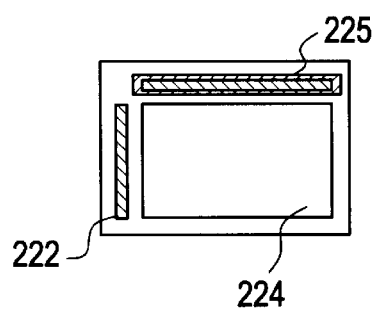

Laser processing of the present embodiment are shown in FIGS. 8A–8G. In FIG. 8A, a laser beam irradiation region 225 is a rectangular form and is large enough to irradiate a whole column driver 223. The rectangular form has 10 mm wide and 200 mm long. A substrate 221 is moved to irradiate the laser light to the column driver 123. At this stage, the laser light is not irradiated to the substrate 221. Subsequently, the substrate 221 is irradiated with the laser light at a substrate temperature of 200° C. in the atmosphere pressure in such a way that the laser beam and the substrate are hardly moved. The laser light is a KrF excimer laser having a wavelength of 248 nm, an oscillation frequency of 10 Hz, and an energy density of 300 mj/cm2. The number of laser pulses is ten shots. After the required number of shots in the laser light are irradiated, the laser irradiation is stopped (FIG. 8B).

Figure 8C:
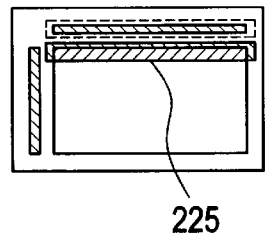

Then, the substrate 221 is move from top to bottom as viewed in FIG. 8C until the irradiation region 225 overlaps the upper end of the active matrix region 224. Unlike Embodiment 2, the scan driver 222 is not irradiated with the laser light.

Figure 8D:
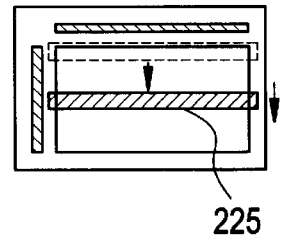

Thereafter, the substrate 221 is moved while irradiated with the laser light (FIG. 8D). The oscillation frequency is 10 Hz. The energy density is 250 mJ/cm2. The scanning speed is 10 mm/sec. Therefore, the irradiation region 225 moves in steps of 1 mm. Since the width of laser light is 10 mm, about 10 shots in the laser light are irradiated to each location.

Figure 8E:
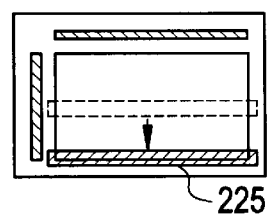

In this way, the laser light is scanned until the lower end of the substrate, so that the active matrix region 224 is irradiated with the laser light (FIG. 8E).

Figure 8F:
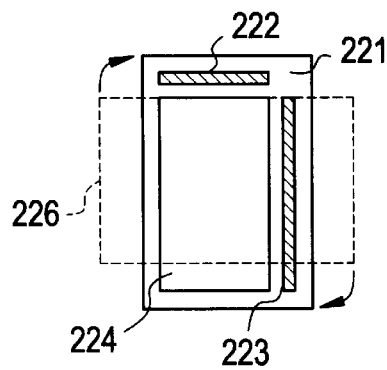
Figure 8G:
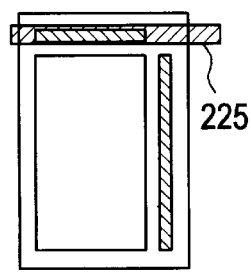

Then, the substrate 221 is rotated at a quarter revolution (FIG. 8F). In FIG. 8F, a square 226 indicated by the dotted line is an initial position of the substrate 221. As shown in FIG. 8G, the substrate 221 is moved to irradiate the laser light to the scan driver 222. At this stage, the laser light is not irradiated to the substrate 221. Thereafter, the scan driver 222 is irradiated with laser light in such a way that the laser beam and the substrate are hardly moved. The oscillation frequency is 10 Hz. The energy density is 300 mJ/cm2. The number of laser pulses is 10 shots. After the required number of shots of the laser light are irradiated, the laser irradiation is stopped.

In the present embodiment, overlap of the laser beam do not produce on the scan driver 222, as well as on the column driver 223. Also in the present embodiment, the driver circuit is irradiated with laser radiation of 300 mJ/cm2 but the active matrix circuit is irradiated with laser radiation of 250 mJ/cm2 in order to obtain TFTs which exhibit small leakage current (OFF current) when a reverse bias voltage is applied to each gate electrode. On the other hand, TFTs of the driver circuit are required to operate at high speeds. Hence, a high mobility is obtained by making the energy of the laser light high.

The scan driver 22 may be irradiated with the laser light after irradiations of the column driver 223 and the active matrix region 224 and rotation of the substrate 221.

EMBODIMENT 4

Laser processes of the present embodiment are illustrated in FIGS. 9A–9G. The present embodiment relates to a monolithic liquid crystal display (LAD) having driver circuits on the upper and lower portions and on the right and left side portions of an active matrix (circuit) region, unlike Embodiments 2 and 3. The present embodiment also relates to a activating process for this display device. This activating step corresponds to activation (process (8)) of the dopant implanted by laser irradiation in Embodiment 1.

FIGS. 10A–10F illustrate the sequence for processing the whole substrate according to the present embodiment. The substrate 101 is made of Corning 7059 and has 300 mm×200 mm in size. A silicon oxide film is formed as a base oxide film 102 at a thickness of 1000 to 5000 Å, for example, 2000 Å, on the substrate 101 by sputtering in an oxygen atmosphere. However, in order to enhance the productivity, the silicon oxide film may be formed by decomposing TEOS by PCVD. Furthermore, the formed silicon oxide film may be annealed at 400 to 650° C.

Then, an amorphous silicon film having a thickness of 300 to 5000 Å, preferably 400 to 1000 Å, for example, 500 Å, is deposited by plasma CVD or LPCVD. The laminate is allowed to stand for 8 to 24 hours in a reducing atmosphere at 550 to 600° C. to crystallize the amorphous silicon film. At this time, a trace amount of a metal element such as nickel which promotes the crystallization may be added. Also, this process may be carried out using laser irradiation. The crystallized silicon film is etched into an island region 103. Then, a silicon oxide film 104 having a thickness of 700 to 1500 Å, for example, 1200 Å, is formed by plasma CVD.

Figure 10A:
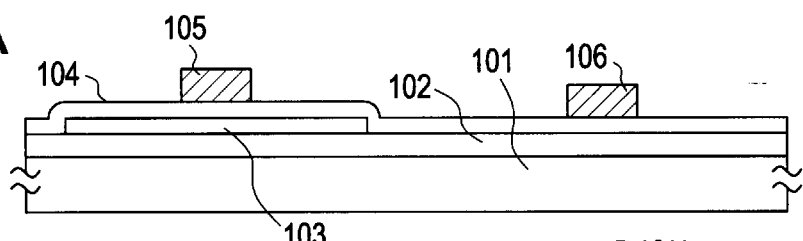
FIGS. 10A–10F are cross sections schematically illustrating manufacturing processes of TFTs according to the invention.

Subsequently, an aluminum film having a thickness of 1000 Å to 3 μm, for example, 5000 Å, and containing 1% by weight of Si or 0.1 to 0.3% by weight of Sc (scandium) is formed by sputtering. The laminate is etched to form a gate electrode 105 and a gate interconnect (wiring) 106 (FIG. 10A).

A current is passed through a gate electrode 105 and through a gate interconnect 106 within an electrolytic solution to perform anodic oxidation. Thus, anodic oxides 107 and 108 each having a thickness of 500 to 2500 Å, for example, 2000 Å, are formed. The electrolytic solution includes L-tartaric acid diluted with ethylene glycol at a concentration of 5%. The pH of this solution is adjusted to 7.0±0.2, using ammonia. The substrate 101 is immersed in this solution. The positive terminal of a constant current source is connected with the gate interconnect on the substrate, while the negative terminal is connected with a platinum electrode. A voltage is applied at a constant current of 20 mA. The oxidation is continued until the voltage reaches 150 V. Furthermore, the oxidation is continued at a constant voltage of 150 V until the current drops below 0.1 mA. As a result, an aluminum oxide film having a thickness of 2000 Å is obtained.

Figure 10B:
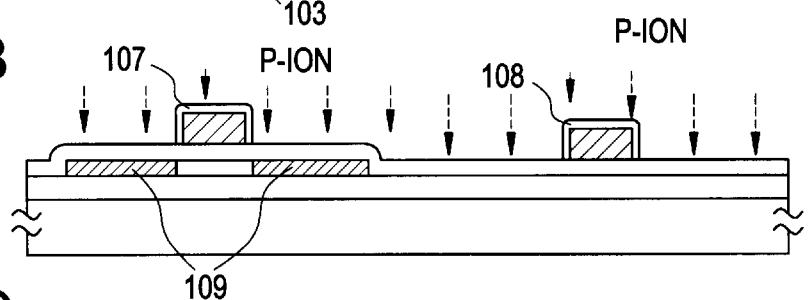
Figure 10C:
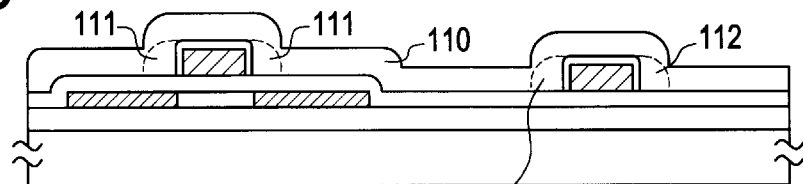

Then, using the gate electrode portion (or, gate electrode and its surrounding anodic oxide film) as a mask, a dopant, or phosphorus, is implanted into the island region (silicon film) 103 in self-aligning by ion doping. As a result, as shown in FIG. 10B, lightly doped drain (LDD) regions 109 are formed. The dose is $1\times10^{13}$ to $5\times10^{14}$ atoms/cm$^2$, for example, $5\times10^{13}$ atoms/cm$^2$. The accelerating voltage is 10 to 90 kV, for example, 80 kV (FIG. 10B).

Thereafter, a silicon oxide film 110 is deposited by plasma CVD. In the present embodiment, TEOS and oxygen are used as raw gases. Alternatively, monosilane and dinitrogen monoxide are employed. The optimum value of the thickness of the silicon oxide film 110 varies depending on tile height of the gate electrode and the gate interconnect. In the present embodiment, the height including the anodic oxide film is about 6000 Å. In this case, the thickness of the silicon oxide film 110 is preferably one third to 2 times this value, for example, 2000 Å to 1.2 μm. In this embodiment, the thickness is set to 6000 Å. In this film formation process, the film thickness in planar portions must be uniform. Also, good step coverage is required. As a result, the thickness of the silicon oxide film on the side surfaces of the gate electrode and the gate interconnect is increased by the portion indicated by the dotted lines in FIG. 10C.

Then, the silicon oxide film 108 is etched by anisotropic dry etching based on well known reactive ion etching (RIE) techniques. This etching process ends when the etched region arrives at the gate insulating film 105. The instant at which the etching process ends can be controlled by, for example, making the etching rate of the gate insulating film 105 smaller than that of the silicon oxide film 110. In consequence, roughly triangular insulators, or side walls 111 and 112, remains on the side surfaces of the gate electrode and the gate interconnect.

Figure 10D:
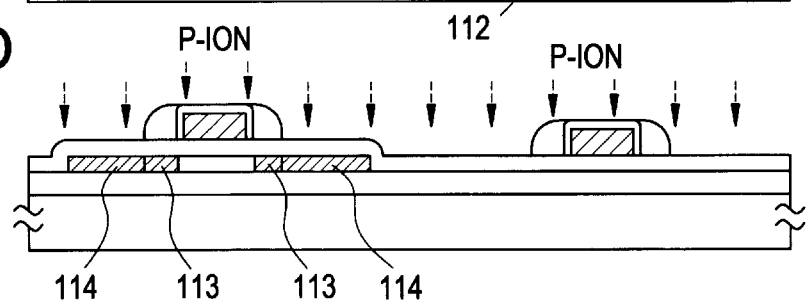

Phosphorus is again introduced by ion doping. The dose is preferably 1 to 3 orders of concentration greater than the dose used in the process illustrated in FIG. 10B. In the present embodiment, the dose is $2\times10^{15}$ atoms/cm$^2$, which is 40 times as great as the dose used in the first doping of phosphorus. The accelerating voltage is 80 kV. As a result, heavily phosphorus-doped regions (source and drain) 114 into which phosphorus having a high concentration is introduced are formed. Lightly doped drain (LDD) regions 113 remains under the side walls 111 and 112 (FIG. 10D).

Figure 10E:
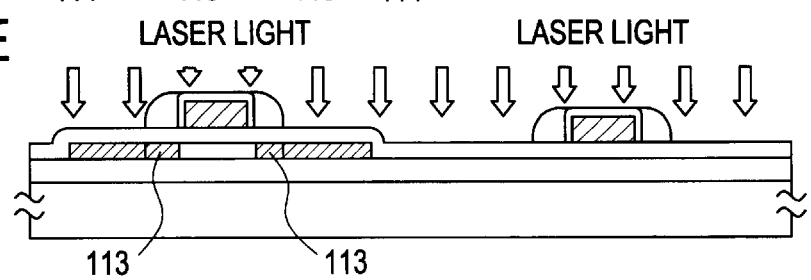

A KrF excimer laser having a wavelength of 248 nm and a pulse width of 20 ns is irradiated to activate the doped impurity. The energy density is 200 to 400 mJ/cm$^2$, preferably 250 to 300 mJ/cm$^2$ (FIG. 10E)

A silicon oxide film is formed as an interlayer insulator 115 having a thickness of 5000 Å over the whole surface of the laminate by CVD. Contact holes are formed in the source and drain regions 114. Second layer aluminum interconnect and electrode 116 and 117 is formed. The thickness of the aluminum interconnect is substantially equal to the thickness of the gate electrode and gate interconnect and 4000 to 6000 Å.

Figure 10F:
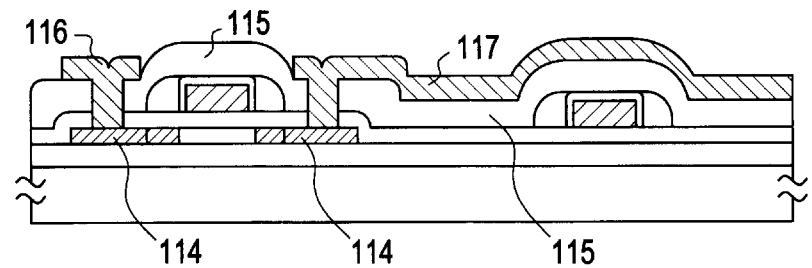

In this way, TFTs having N-channel LDDs are completed. To activate the impurity regions, hydrogen annealing may be performed at 200 to 400° C. The second layer interconnect 117 gets over the gate interconnects 106, thus forming a step. This step is made milder by the presence of the side wall 112. Therefore, little steep step edges are observed although the second layer interconnect is substantially equal in thickness to the gate electrode and interconnect (FIG. 10F).

Of the above processes, the process for activating the dopant (impurity) by laser irradiation in FIG. 10E will be described.

Figure 11:
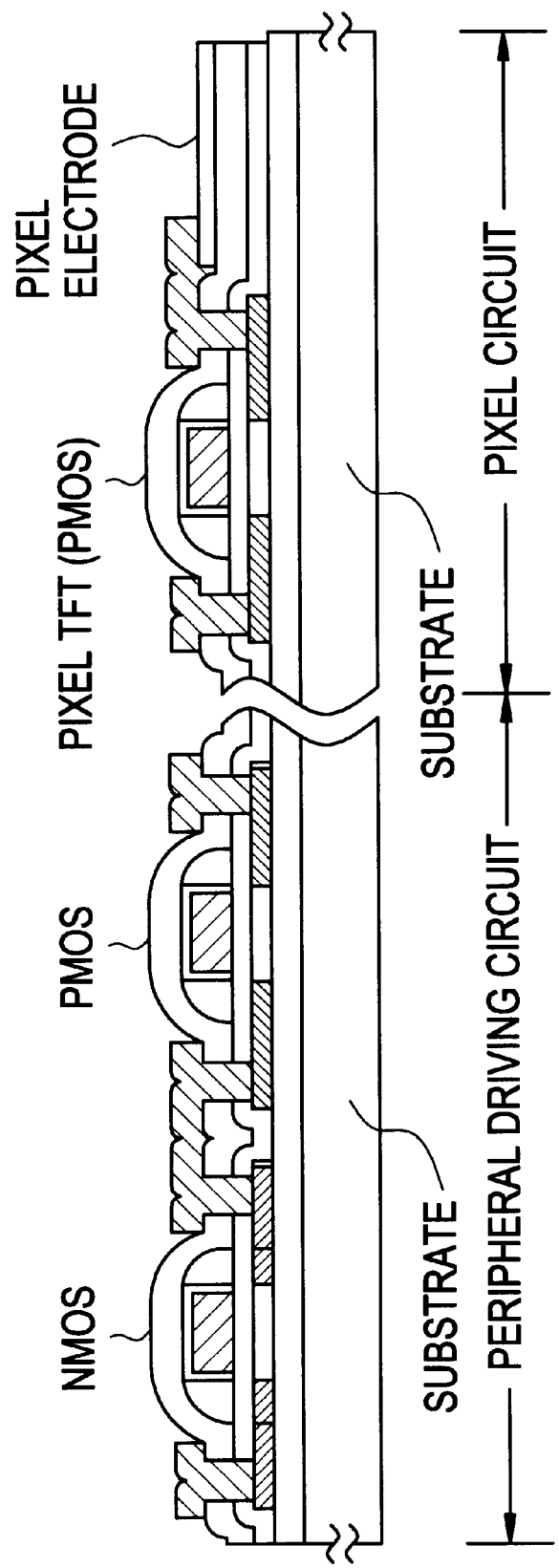
FIG. 11 is a cross-sectional view of a TFT circuit.

FIG. 11 shows a cross section of a substrate processed in the present embodiment. A peripheral driver circuit region and a pixel circuit region are formed on the substrate. The peripheral driver circuit region has NMOS TFTs and PMOS TFTs. The pixel circuit has PMOS TFTs which are connected with pixel electrodes.

Figure 9A:
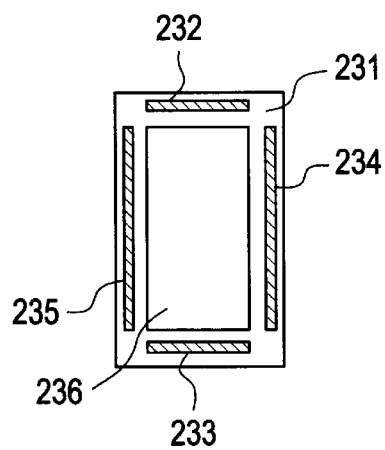
FIGS. 9A–9G are views illustrating another laser processing method according to the invention.

FIG. 9A is a top view of the substrate to be processed in the present embodiment. In FIG. 10E, an interlayer insulator and a second layer interconnect are not formed. As shown in FIG. 9A, scan drivers 232 and 233, column drivers 234 and 235, and an active matrix circuit 236 are formed on a substrate 231. A laser beam irradiation region 237 has a rectangular form and is large enough to irradiate the whole column drivers 234 and 235. The rectangular form is 10 mm wide and 300 mm long.

Figure 9B:
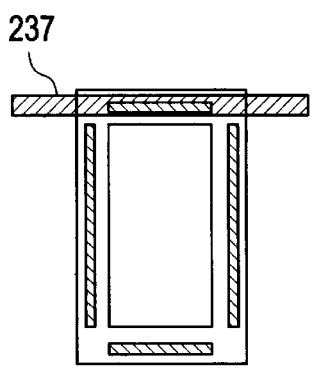

In FIG. 9B, the substrate 231 is moved to irradiate the laser light to the scan driver 232. At this stage, the laser light is not irradiated to the substrate 231. Thereafter, the laser radiation is performed at a substrate temperature of 200° C. in an atmosphere pressure in such a way that the laser beam and the substrate 231 are hardly moved. The laser light is a KrF excimer laser having a wavelength of 248 nm, an oscillation frequency of 10 Hz, and an energy density of 300 mJ/cm2. The number of pulses in the laser beam is 10 shots. After the required number of shots are irradiated, the laser irradiation is stopped.

Figure 9C:
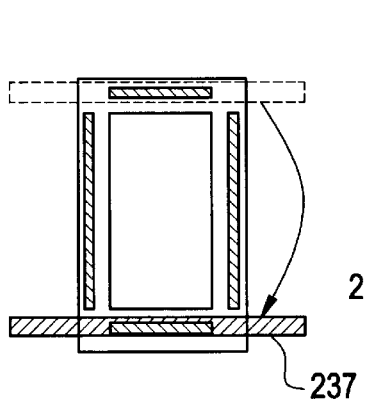

Thereafter, the substrate 231 is moved to irradiate the laser light to the scan driver 233. 10 shots of the laser light are irradiated under the same conditions as the above described conditions without moving the substrate 231 and the laser beam (corresponding to the laser beam irradiation region). After a required number of shots are irradiated, the laser irradiation is stopped (FIG. 9C).

Figure 9D:
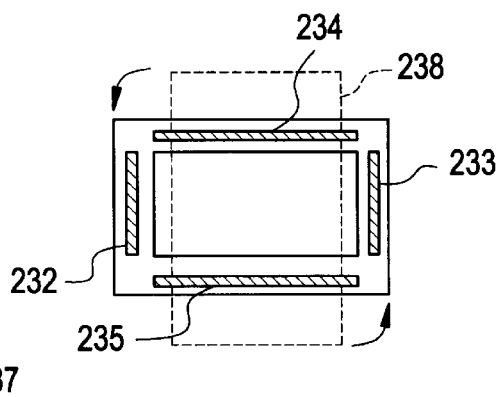
Figure 9E:
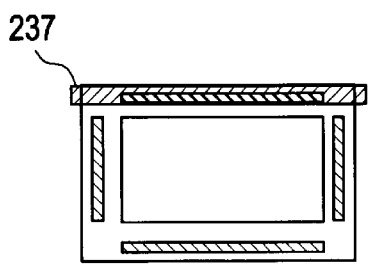

Then, the substrate 231 is rotated at a quarter revolution (FIG. 9D). A square 238 indicated by the dotted line is an initial position of the substrate 231. In FIG. 9E, the substrate 231 is moved to irradiate the laser light to the column driver 234. Then, 10 shots of the laser light are irradiated under the same conditions as the above described conditions without moving the substrate 231 and the laser beam. After a required number of shots of laser light are irradiated, the laser irradiation is stopped (FIG. 9E).

Figure 9F:
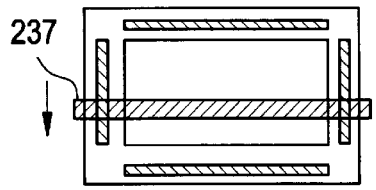
Figure 9G:
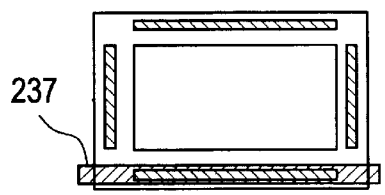

Thereafter, the substrate 231 is moved from top to bottom as viewed in FIG. 9F to the position where the irradiation region 237 overlaps upper portions of the active matrix circuit 236 and the scan drivers 232, 233. Then, the irradiation region 237 is moved in the direction indicated by the arrow while irradiated with the laser radiation. The oscillation frequency is 10 Hz. The energy density is 250 mJ/cm2. The scanning speed is 10 mm/sec. Consequently, the irradiation region 237 moves in steps of 1 mm. Since the width of the laser light is 10 mm, about 10 shots of the laser light are irradiated to each location.

The laser light is scanned to the lower end of the active matrix circuit 236 and then the laser irradiation is stopped.

As shown in FIG. 10G, the substrate 231 is moved to irradiate the laser beam to the column driver 235. Then, the column driver 235 is irradiated with the laser light without moving the laser beam and the substrate 231. The oscillation frequency is 10 Hz. The energy density is 300 mJ/cm2. The number of shots of the laser light is 10 shots. After a required number of shots of laser light are irradiated, the laser irradiation is stopped.

In the present embodiment, overlap of the laser beam do not produce in the column driver. On the other hand, in the scan driver, the laser beams do not overlap in the laser irradiation processes shown in FIGS. 9B and 9C but overlaps occur when the active matrix circuit is irradiated with the laser beam. However, admissible variations in characteristics of the TFTs forming the scan driver is larger than that in the TFTs forming the column driver. Also, since the energy of the laser light irradiated to the active matrix circuit is smaller than the energy of the first laser irradiation, substantially effects do not produce.

The laser irradiation techniques of the present invention improve,the uniformity of semiconductor devices while maintaining the productivity. The present invention can be applied to every laser process used to process semiconductor devices. Especially, where TFTs are used as semiconductor devices, the uniformity of the threshold voltages of the TFTs can be effectively enhanced by irradiating the polycrystalline silicon film with laser light. Furthermore, where the invention is applied to activation of the impurity element in the source and drain and the above process is also carried out, the field mobilities of the TFTs or the uniformity of the ON currents can be effectively improved. In this way, the present invention is useful for industry.

What is claimed is:

1. A method of manufacturing a display device having an active matrix circuit and a driver circuit both formed over a same substrate, said driver circuit including at least one CMOS device comprising an N-channel type thin film transistor and a P-channel type thin film transistor, said method comprising the steps of:

forming a semiconductor film comprising amorphous silicon over said substrate;

crystallizing said semiconductor film by heating;

irradiating said semiconductor film with a laser light after said crystallizing step wherein an irradiation area of said laser light on said semiconductor film is elongated in one direction;

etching the crystallized semiconductor film after the irradiating step into at least one semiconductor island; and introducing an N-type impurity into portions of said semiconductor island to form source and drain regions and at least one lightly doped region for said N-channel type thin film transistor, wherein said P-channel type thin film transistor has no lightly doped region.

2. A method according to claim 1 wherein the crystallization of said semiconductor film is promoted by adding a metal element.

3. A method according to claim 1 further comprising a step of annealing the semiconductor island in a hydrogen atmosphere after the introduction of the N-type impurity.

4. A method according to claim 1 wherein said laser is a pulsed excimer laser.

5. A method according to claim 3 wherein a dose amount of said lightly doped region is $1 \times 10^{13}$ to $5 \times 10^{14}$ atoms/cm$^2$.

6. A method according to claim 1 wherein said irradiating step is performed without moving said laser light at a region of said driver circuit.

7. A method according to claim 1 wherein said irradiating step is performed so that one portion of said semiconductor film is irradiated with 10 pulses of said laser light.

8. A method of manufacturing a display device having an active matrix circuit and a driver circuit both formed over a same substrate, said driver circuit including at least one CMOS device comprising an N-channel type thin film transistor and a P-channel type thin film transistor, said method comprising the steps of:

forming a semiconductor film comprising amorphous silicon over said substrate;

crystallizing said semiconductor film by heating;

irradiating said semiconductor film with a laser light after said crystallizing step wherein an irradiation area of said laser light on said semiconductor film is elongated in one direction;

etching the crystallized semiconductor film after the irradiating step into at least one semiconductor island; and introducing an N-type impurity into portions of said semiconductor island to form source and drain regions and at least one lightly doped region for said N-channel type thin film transistor, wherein said lightly doped region is formed only in said N-channel type thin film transistor.

9. A method according to claim 8 wherein the crystallization of said semiconductor film is promoted by adding a metal element.

10. A method according to claim 8 further comprising a step of annealing the semiconductor island in a hydrogen atmosphere after the introduction of the N-type impurity.

11. A method according to claim 8 wherein said laser is a pulsed excimer laser.

12. A method according to claim 8 wherein a dose amount of said lightly doped region is $1 \times 10^{13}$ to $5 \times 10^{14}$ atoms/cm$^2$.

13. A method according to claim 8 wherein said irradiating step is performed without moving said laser light at a region of said driver circuit.

14. A method according to claim 8 wherein said irradiating step is performed so that one portion of said semiconductor film is irradiated with 10 pulses of said laser light.

15. A method of manufacturing a display device having an active matrix circuit and a driver circuit both formed over a same substrate, said driver circuit including at least one CMOS device comprising an N-channel type thin film transistor and a P-channel type thin film transistor, said method comprising the steps of:

forming a semiconductor film comprising amorphous silicon over said substrate;

crystallizing said semiconductor film by heating;

irradiating said semiconductor film with a laser light after said crystallizing step wherein an irradiation area of said laser light on said semiconductor film is elongated in one direction;

etching the crystallized semiconductor film after the irradiating step into at least one semiconductor island;

introducing an N-type impurity into portions of said semiconductor island to form source and drain regions and at least one lightly doped region for said N-channel type thin film transistor; and forming an interlayer insulating film over said semiconductor island, wherein said P-channel type thin film transistor has no lightly doped region.

16. A method according to claim 15 wherein the crystallization of said semiconductor film is promoted by adding a metal element.

17. A method according to claim 15 further comprising a step of annealing the semiconductor island in a hydrogen atmosphere after the introduction of the N-type impurity.

18. A method according to claim 15 wherein said laser is a pulsed excimer laser.

19. A method according to claim 15 wherein a dose amount of said lightly doped region is $1 \times 10^{13}$ to $5 \times 10^{14}$ atoms/cm$^2$.

20. A method according to claim 15 wherein said interlayer insulating film comprises silicon oxide.

21. A method according to claim 15 wherein said irradiating step is performed without moving said laser light at a region of said driver circuit.

22. A method according to claim 15 wherein said irradiating step is performed so that one portion of said semiconductor film is irradiated with 10 pulses of said laser light.

23. A method of manufacturing a display device having an active matrix circuit and a driver circuit both formed over a same substrate, said driver circuit including at least one CMOS device comprising an N-channel type thin film transistor and a P-channel type thin film transistor, said method comprising the steps of:

forming a semiconductor film comprising silicon over said substrate;

irradiating said semiconductor film with a laser light wherein an irradiation area of said laser light on said semiconductor film is elongated in one direction;

etching the semiconductor film after the irradiating step into at least one semiconductor island; and introducing an N-type impurity into portions of said semiconductor island to form source and drain regions and at least one lightly doped region for said N-channel type thin film transistor, wherein said P-channel type thin film transistor has no lightly doped region.

24. A method according to claim 23 wherein said semiconductor film comprises crystalline silicon.

25. A method according to claim 23 further comprising a step of annealing the semiconductor island in a hydrogen atmosphere after the introduction of the N-type impurity.

26. A method according to claim 23 wherein said laser is a pulsed excimer laser.

27. A method according to claim 23 wherein a dose amount of said lightly doped region is $1 \times 10^{13}$ to $5 \times 10^{14}$ atoms/cm$^2$.

28. A method according to claim 23 wherein said irradiating step is performed without moving said laser light at a region of said driver circuit.

29. A method according to claim 23 wherein said irradiating step is performed so that one portion of said semiconductor film is irradiated with 10 pulses of said laser light.

30. A method of manufacturing a display device having an active matrix circuit and a driver circuit both formed over a same substrate, said driver circuit including at least one CMOS device comprising an N-channel type thin film transistor and a P-channel type thin film transistor, said method comprising the steps of:

forming a semiconductor film comprising silicon over said substrate;

irradiating said semiconductor film with a laser light wherein an irradiation area of said laser light on said semiconductor film is elongated in one direction;

etching the semiconductor film after the irradiating step into at least one semiconductor island; and introducing an N-type impurity into portions of said semiconductor island to form source and drain regions and at least one lightly doped region for said N-channel type thin film transistor, wherein said lightly doped region is formed only in said N-channel type thin film transistor.

31. A method according to claim 30 wherein said semiconductor film comprises crystalline silicon.

32. A method according to claim 30 further comprising a step of annealing the semiconductor island in a hydrogen atmosphere after the introduction of the N-type impurity.

33. A method according to claim 30 wherein said laser is a pulsed excimer laser.

34. A method according to claim 30 wherein a dose amount of said lightly doped region is $1\times10^{13}$ to $5\times10^{14}$ atoms/cm$^2$.

35. A method according to claim 30 wherein said irradiating step is performed without moving said laser light at a region of said driver circuit.

36. A method according to claim 30 wherein said irradiating step is performed so that one portion of said semiconductor film is irradiated with 10 pulses of said laser light.

37. A method of manufacturing a display device having an active matrix circuit and a driver circuit both formed over a same substrate, said driver circuit including at least one CMOS device comprising an N-channel type thin film transistor and a P-channel type thin film transistor, said method comprising the steps of:

forming a semiconductor film comprising silicon over said substrate;

irradiating said semiconductor film with a laser light wherein an irradiation area of said laser light on said semiconductor film is elongated in one direction;

etching the semiconductor film after the irradiating step into at least one semiconductor island;

introducing an N-type impurity into portions of said semiconductor island to form source and drain regions and at least one lightly doped region for said N-channel type thin film transistor; and forming an interlayer insulating film over said semiconductor island, wherein said P-channel type thin film transistor has no lightly doped region.

38. A method according to claim 37 wherein comprises crystalline silicon.

39. A method according to claim 37 further comprising a step of annealing the semiconductor island in a hydrogen atmosphere after the introduction of N-type impurity.

40. A method according to claim 37 wherein said laser is a pulsed excimer laser.

41. A method according to claim 37 wherein a dose amount of said lightly doped region is $1\times10^{13}$ to $5\times10^{14}$ atoms/cm$^2$.

42. A method according to claim 37 wherein said interlayer insulating film comprises silicon oxide.

43. A method according to claim 37 wherein said irradiating step is performed without moving said laser light at a region of said driver circuit.

44. A method according to claim 37 wherein said irradiating step is performed so that one portion of said semiconductor film is irradiated with 10 pulses of said laser light.

* * * * *